(12) United States Patent
Kogure et al.

(10) Patent No.: US 9,119,318 B2
(45) Date of Patent: Aug. 25, 2015

(54) MULTILAYER SUBSTRATE MODULE

(71) Applicant: Murata Manufacturing Co., Ltd., Nagaokakyo-shi, Kyoto-fu (JP)

(72) Inventors: Takeshi Kogure, Nagaokakyo (JP); Hiromichi Kitajima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 47 days.

(21) Appl. No.: 14/148,979

(22) Filed: Jan. 7, 2014

(65) Prior Publication Data

US 2014/0202750 A1    Jul. 24, 2014

(30) Foreign Application Priority Data

Jan. 21, 2013  (JP) ................... 2013-007997

(51) Int. Cl.
*H05K 1/16* (2006.01)
*H05K 1/02* (2006.01)

(52) U.S. Cl.
CPC .............. *H05K 1/165* (2013.01); *H05K 1/0298* (2013.01); *H05K 2201/0792* (2013.01); *H05K 2201/0969* (2013.01); *H05K 2201/09309* (2013.01)

(58) Field of Classification Search
CPC ..................................................... H05K 1/165
See application file for complete search history.

(56) References Cited

U.S. PATENT DOCUMENTS

| | | |
|---|---|---|
| 5,232,765 A | 8/1993 | Yano et al. |
| 6,384,706 B1 * | 5/2002 | Iwanami ........................ 336/200 |
| 2003/0063427 A1 * | 4/2003 | Kunihiro ........................ 361/277 |
| 2011/0157857 A1 | 6/2011 | Matsumoto et al. |
| 2011/0234295 A1 | 9/2011 | Uejima et al. |

FOREIGN PATENT DOCUMENTS

| | | |
|---|---|---|
| JP | 4-82297 A | 3/1992 |
| JP | 2004-311734 A | 11/2004 |
| JP | 2011-77723 A | 4/2011 |
| JP | 2011-151367 A | 8/2011 |
| JP | 2011-171501 A | 9/2011 |
| WO | WO2012128271 * | 9/2012 ............... H04B 1/40 |

OTHER PUBLICATIONS

Official Communication issued in corresponding Japanese Patent Application No. 2013-007997, mailed on Dec. 16, 2014.

* cited by examiner

*Primary Examiner* — Jeremy C Norris
(74) *Attorney, Agent, or Firm* — Keating & Bennett, LLP

(57) ABSTRACT

A multilayer substrate module includes a multilayer circuit substrate, a mounting land, and an input/output terminal. Inside the multilayer circuit substrate, a wiring line that connects the mounting land and the input/output terminal to each other, an inductor that defines a portion of the wiring line, a first ground conductor that is positioned on the one main surface side of the inductor, and a second ground conductor that is positioned on the other main surface side of the inductor are defined by conductor patterns. The area where inductor is located is not superposed with the area where the second ground conductor is located, when the one main surface or the other main surface of the multilayer circuit substrate is viewed in plan, the second ground conductor being closer to the layer where the inductor is located than the first ground conductor is.

19 Claims, 12 Drawing Sheets

MULTILAYER SUBSTRATE MODULE

BACKGROUND OF THE INVENTION

1. Field of the Invention

The present invention relates to multilayer substrate modules mounted in communication devices such as cellular phones.

2. Description of the Related Art

In the related art, various known multilayer substrate modules are known are mounted in communication devices such as cellular phones. A multilayer substrate module of the related art includes a multilayer circuit substrate formed of a plurality of layers stacked on top of one another with conductor patterns being formed on the layers; a mounting land formed on one main surface of the multilayer circuit substrate; and an input/output terminal formed on the other main surface of the multilayer circuit substrate. A wiring line that connects the mounting land and the input/output terminal to each other, and a ground conductor are formed of conductor patterns inside the multilayer circuit substrate.

In recent years, the distance between the wiring line, which is connected to the input/output terminal, and the ground conductor has tended to become smaller in such multilayer substrate modules as the profile of the multilayer circuit substrate has decreased. Consequently, there has been a problem in that a capacitance is generated between the wiring line and the ground conductor, the impedance of the input/output terminal becomes capacitive and insertion loss (IL) is increased due to impedance mismatching.

Consequently, in Japanese Unexamined Patent Application Publication No. 2011-77723, a multilayer substrate module is disclosed in which an inductor that is connected to an input/output terminal is formed inside a multilayer circuit substrate in order to improve matching.

However, when an inductor is formed inside a multilayer substrate module and the inductor is close to a ground conductor as in Japanese Unexamined Patent Application Publication No. 2011-77723, a magnetic field is generated by the inductor when a signal is transmitted through the inductor and an eddy current is generated in the portion of the ground conductor that faces the inductor. In particular, in a multilayer substrate module having a low profile structure, the distance between the inductor and the ground conductor is even smaller and therefore the eddy current is larger.

Consequently, in the multilayer substrate module of Japanese Unexamined Patent Application Publication No. 2011-77723, there is a problem in that the Q value of the inductor is degraded and an IL improvement effect is not sufficiently obtained.

SUMMARY OF THE INVENTION

Accordingly, preferred embodiments of the present invention provide a multilayer substrate module that improves the Q value of an inductor and in which an IL improvement effect is sufficiently obtained.

A multilayer substrate module according to a preferred embodiment of the present invention includes a multilayer circuit substrate that includes a plurality of layers stacked on top of one another with conductor patterns being located on the layers; a first external connection terminal that is located on one main surface of the multilayer circuit substrate; and a second external connection terminal that is located on another main surface of the multilayer circuit substrate. A wiring line that connects the first external connection terminal and the second external connection terminal to each other, an inductor that defines a portion of the wiring line, a first ground conductor that is positioned on the one main surface side of the inductor, and a second ground conductor that is positioned on the other main surface side of the inductor are defined by the conductor patterns inside the multilayer circuit substrate. An area where the inductor is provided is not superposed with an area where a ground conductor, out of first ground conductor and the second ground conductor, that is closer to the layer where the inductor is located, is provided when the one main surface or the other main surface of the multilayer circuit substrate is viewed in plan.

In this configuration, the ground conductor that is closer to the layer where the inductor is located out of the first and second ground conductors does not face the inductor. Consequently, even though a magnetic field is generated by the inductor when a signal is transmitted through the inductor, this magnetic field substantially does not act on that ground conductor and generation of an eddy current in that ground conductor is sufficiently reduced or prevented.

Therefore, with this configuration, the Q value of the inductor is improved and an IL improvement effect is sufficiently obtained.

It is preferable that the area where the inductor is provided be superposed with at least one of the area where the first external connection terminal is provided and the area where the second external connection terminal is provided when the one main surface or the other main surface of the multilayer circuit substrate is viewed in plan.

In this configuration, a third external connection terminal is located in a region where the first external connection terminal is not provided on the one main surface of the multilayer circuit substrate. Alternatively, a third external connection terminal is located in a region where the second external connection terminal is not provided on the other main surface of the multilayer circuit substrate.

Consequently, in this configuration, the area where the inductor is located is not superposed with the area where the third external connection terminal is located. That is, in this configuration, the third external connection terminal is spaced away from the inductor in the multilayer circuit substrate. Therefore, with this configuration, even though the inductor is provided, degradation of isolation characteristics of the third external connection terminal is prevented.

It is preferable that an opening be provided in the ground conductor such that the area where the ground conductor is located is not superposed with the area where the inductor is located when the one main surface or the other main surface of the multilayer circuit substrate is viewed in plan.

In this configuration, as a result of providing an opening in a portion of the ground conductor, the area where the inductor is located is not superposed with the area where the ground conductor is located when the one main surface or the other main surface of the multilayer circuit substrate is viewed in plan.

Therefore, with this configuration, a multilayer circuit substrate is provided in which the area where the inductor is located is arranged to be not superposed with the area where a ground conductor is located by simply providing an opening in a portion of the ground conductor. Therefore, with this configuration, there is no need to change the design of the conductor patterns in the area where the inductor is located and therefore the cost of manufacturing the multilayer substrate module is reduced.

It is preferable that a portion of the inductor define a first inductor, that the remaining portion of the inductor define a second inductor, and that the first inductor be located in an area that is not superposed with the second inductor when the one main surface or the other main surface of the multilayer circuit substrate is viewed in plan.

In this configuration, when the one main surface or the other main surface of the multilayer circuit substrate is viewed in plan, the area where the first ground conductor is located, the first ground conductor being closer to the layer where the first inductor is located than the second ground conductor, and the area where the first inductor is located can be arranged to be not superposed with each other.

Similarly, in this configuration, when the one main surface or the other main surface of the multilayer circuit substrate is viewed in plan, the area where the second ground conductor is located, the second ground conductor being closer to the layer where the second inductor is located than the first ground conductor, and the area where the second inductor is located can be arranged to be not superposed with each other.

Therefore, in this configuration, even though magnetic fields are generated by the inductors when a signal is transmitted through the inductors, the magnetic fields substantially do not act on the first ground conductor and the second ground conductor and generation of an eddy current is sufficiently reduced or prevented in both the first ground conductor and the second ground conductor.

Therefore, with this configuration, the Q values of the inductors is further improved. Consequently, a higher IL improvement effect is obtained.

The area where the inductor is located is preferably not superposed with either of the area where the first ground conductor is located and the area where the second ground conductor is located when the one main surface or the other main surface of the multilayer circuit substrate is viewed in plan.

In this configuration, even though a magnetic field is generated by the inductor when a signal is transmitted through the inductor, the magnetic field substantially does not act on the first ground conductor and the second ground conductor and generation of an eddy current can be sufficiently suppressed in both the first ground conductor and the second ground conductor.

Therefore, with this configuration, the Q value of the inductor is further improved. Consequently, a higher IL improvement effect is obtained.

The inductor is preferably connected in series with the first external connection terminal.

The inductor preferably connects the wiring line to the first ground conductor or the second ground conductor.

With various preferred embodiments of the present invention, the Q value of an inductor is improved and an IL improvement effect is sufficiently obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Hereafter, a multilayer substrate module 100 according to a first preferred embodiment of the present invention will be described.

Figure 1:
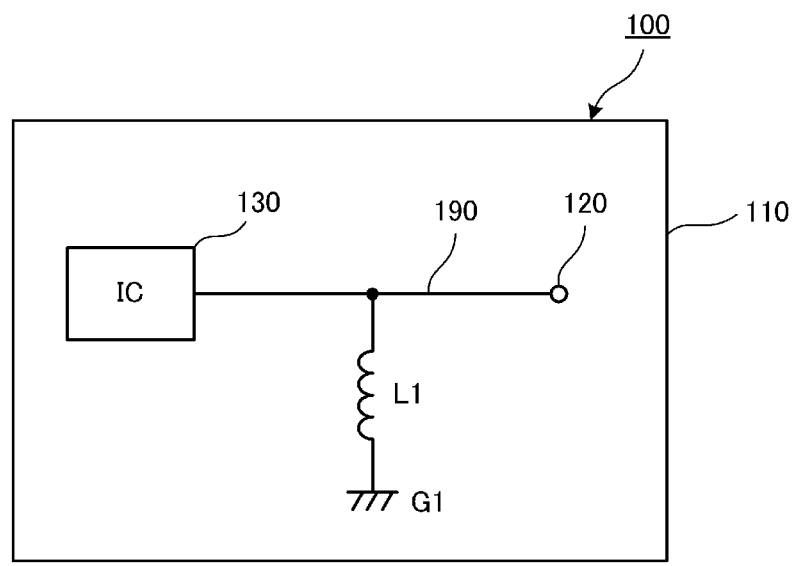
FIG. 1 is a circuit diagram of a multilayer substrate module according to a first preferred embodiment of the present invention.
Figure 2:
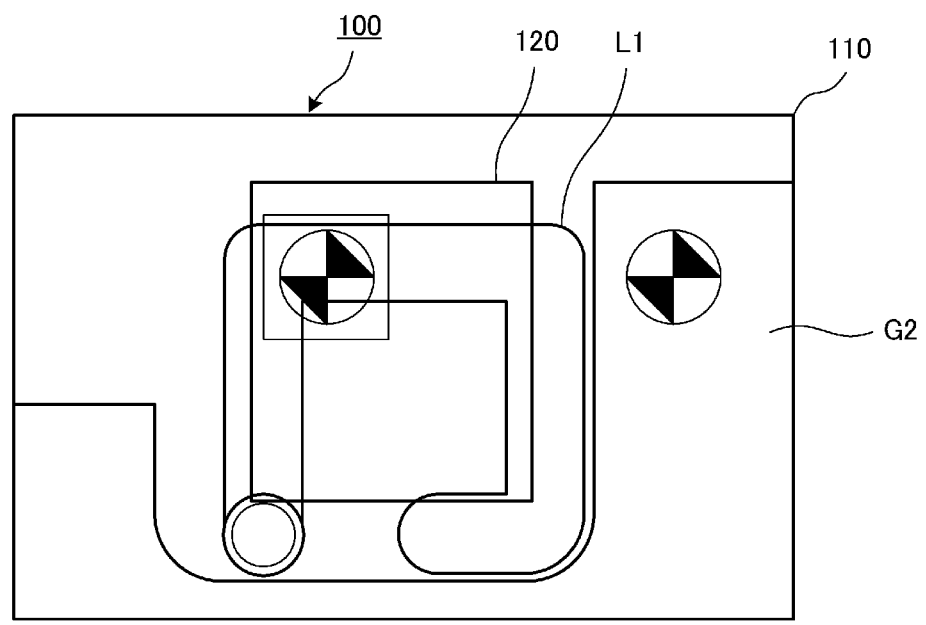
FIG. 2 is a transparent plan view of a principle portion of the multilayer substrate module illustrated in FIG. 1.
Figure 3:
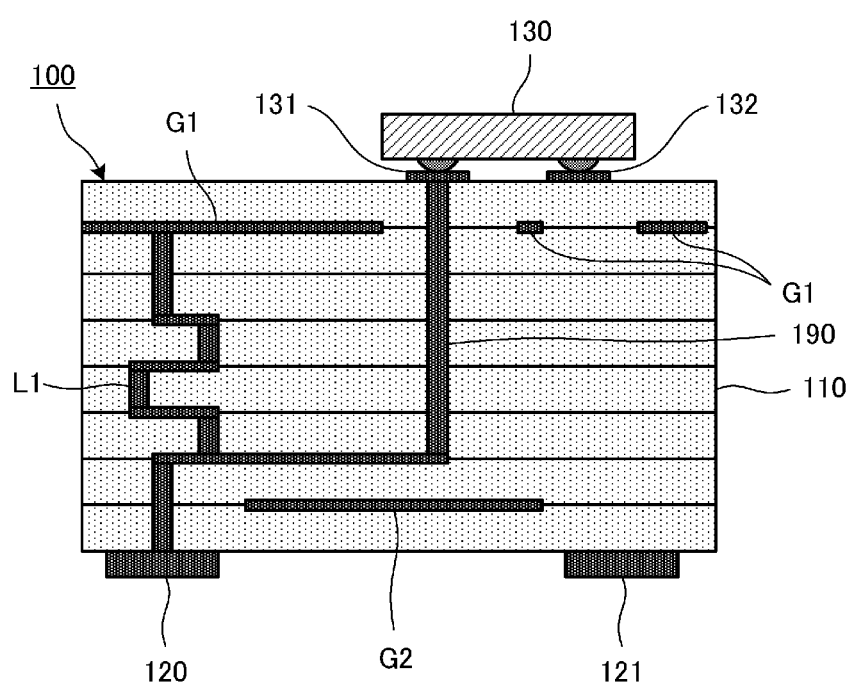
FIG. 3 is a sectional view of a principle portion of the multilayer substrate module illustrated in FIG. 1.

FIG. 1 is a circuit diagram of the multilayer substrate module 100 according to the first preferred embodiment of the present invention. FIG. 2 is a transparent plan view of a principle portion of the multilayer substrate module 100 taken when another main surface of a multilayer circuit substrate 110 illustrated in FIG. 1 is viewed in plan. FIG. 3 is a sectional view of a principle portion of the multilayer substrate module 100 illustrated in FIG. 1.

The multilayer substrate module 100 includes the multilayer circuit substrate 110, mounting lands 131 and 132, and input/output terminals 120 and 121. The mounting land 131 corresponds to a "first external connection terminal". In addition, the input/output terminal 120 corresponds to a "second external connection terminal". In addition, the mounting land 132 and the input/output terminal 121 each correspond to a "third external connection terminal".

The multilayer circuit substrate 110 is a multilayer body including a plurality of dielectric layers stacked on top of one another with conductor patterns being located on the dielectric layers. The dielectric layers are, for example, composed of a ceramic or a resin. The conductor patterns are formed on the dielectric layers of the multilayer circuit substrate 110 preferably by, for example, using a screen printing method employing a screen printing plate.

The input/output terminals 120 and 121 are defined on the other main surface (bottom surface) of the multilayer circuit substrate 110 by conductor patterns. The input/output terminals 120 and 121 are terminals that allow connection to a circuit outside of the multilayer substrate module 100.

The mounting lands 131 and 132 are defined by conductor patterns on the one main surface (top surface) of the multilayer circuit substrate 110. A switch IC 130 of the multilayer substrate module 100 is mounted on the mounting lands 131 and 132.

The switch IC 130 preferably is, for example, an FET switch IC having a CMOS structure and having a rectangular or substantially rectangular shape when viewed in plan. The switch IC 130 includes an antenna connection port that is connected to an antenna and a plurality of high-frequency input/output ports (transmission port, reception port, and transmission/reception port). The switch IC 130 performs switching control using a control signal so as to connect any one of the high-frequency signal input/output ports to the antenna connection port.

Inside the multilayer circuit substrate 110, as illustrated in FIG. 1 and FIG. 3, a wiring line 190 that connects the mounting land 131 and the input/output terminal 120 to each other, an inductor L1 that defines a portion of the wiring line 190, a first ground conductor G1 that is positioned on the one main surface side of the inductor L1, and a second ground conductor G2 that is positioned on the other main surface side of the inductor L1 are defined by conductor patterns.

The inductor L1 shunt-connects the wiring line 190 to the first ground conductor G1. In addition, the area where the inductor L1 is located, as illustrated in FIG. 2 and FIG. 3, is superposed with the area where the input/output terminal 120 is located when the one main surface or the other main surface of the multilayer circuit substrate 110 is viewed in plan.

Here, the area where the inductor L1 is located is not superposed with the area where the second ground conductor G2 is located, when the one main surface or the other main surface of the multilayer circuit substrate 110 is viewed in plan, as illustrated in FIG. 2 and FIG. 3, the second ground conductor G2 being closer to the layer where the inductor L1 is located than the first ground conductor G1 is. That is, the second ground conductor G2 does not face the inductor L1.

Consequently, even though a magnetic field is generated by the inductor L1 when a signal is transmitted through the inductor L1, this magnetic field substantially does not act on the second ground conductor G2 and generation of an eddy current in the second ground conductor G2 is sufficiently reduced or prevented.

Therefore, the Q value of the inductor L1 is improved and the IL improvement effect is sufficiently obtained with the multilayer substrate module 100.

In addition, the area where the inductor L1 is located, as illustrated in FIG. 2 and FIG. 3, is superposed with the area where the input/output terminal 120 is located when the one main surface or the other main surface of the multilayer circuit substrate 110 is viewed in plan. Furthermore, the other input/output terminal 121 is located in a region in which the input/output terminal 120 is not located on the other main surface of the multilayer circuit substrate 110.

Consequently, in the multilayer substrate module 100, the area where the inductor L1 is located is not superposed with the area where the input/output terminal 121 is located. That is, the multilayer substrate module 100 has a structure in which the input/output terminal 121 is spaced apart from the inductor L1 in the multilayer circuit substrate 110.

Therefore, with the multilayer substrate module 100, even though the inductor L1 is provided, degradation of the isolation characteristics of the input/output terminal 121 is prevented.

Second Preferred Embodiment

Hereafter, a multilayer substrate module 200 according to a second preferred embodiment of the present invention will be described.

Figure 4:
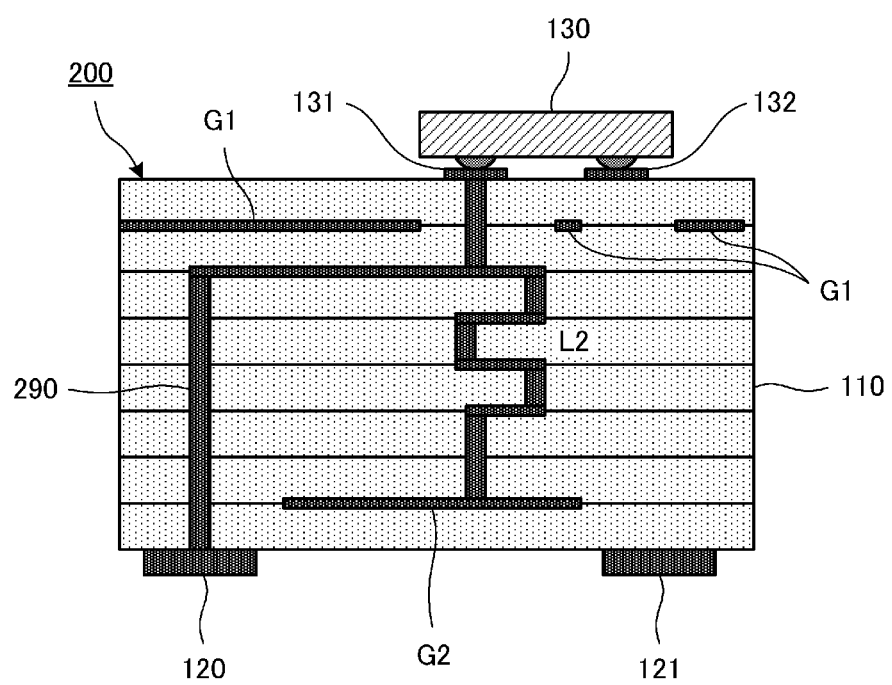
FIG. 4 is a sectional view of a principle portion of a multilayer substrate module according to a second preferred embodiment of the present invention.

FIG. 4 is a sectional view of a principle portion of the multilayer substrate module 200 according to the second preferred embodiment of the present invention. The multilayer substrate module 200 according to the second preferred embodiment differs from the multilayer substrate module 100 according to the first preferred embodiment in that it includes a wiring line 290 instead of the wiring line 190. The rest of the configuration of the multilayer substrate module 200 is preferably the same or substantially the same as that of the multilayer substrate module 100 and therefore description thereof will be omitted.

In more detail, inside the multilayer circuit substrate 110, as illustrated in FIG. 4, the wiring line 290 that connects the mounting land 131 and the input/output terminal 120, an inductor L2 that defines a portion of the wiring line 290, the first ground conductor G1 and the second ground conductor G2 are defined by conductor patterns.

The inductor L2 shunt connects the wiring line 290 to the second ground conductor G2. In addition, the area where the inductor L2 is located is superposed with the area where the mounting land 131 is located when the one main surface or the other main surface of the multilayer circuit substrate 110 is viewed in plan.

Here, the area where the inductor L2 is located is not superposed with the area where the first ground conductor G1 is located when the one main surface or the other main surface of the multilayer circuit substrate 110 is viewed in plan, as illustrated in FIG. 4, the first ground conductor G1 being closer to the layer where the inductor L2 is located than the second ground conductor G2 is. That is, the first ground conductor G1 does not face the inductor L2.

Consequently, even though a magnetic field is generated by the inductor L2 when a signal is transmitted through the inductor L2, this magnetic field substantially does not act on the first ground conductor G1 and generation of an eddy current in the first ground conductor G1 is sufficiently reduced or prevented.

Therefore, the same effect as with the multilayer substrate module 100 is obtained with the multilayer substrate module 200.

In addition, the area where the inductor L2 is located, as illustrated in FIG. 4, is superposed with the area where the mounting land 131 is located when the one main surface or the other main surface of the multilayer circuit substrate 110 is viewed in plan. Furthermore, the other mounting land 132 is located in a region in which the mounting land 131 is not located on the one main surface of the multilayer circuit substrate 110.

Consequently, in the multilayer substrate module 200, the area where the inductor L2 is located is not superposed with the area where the mounting land 132 is located. That is, the multilayer substrate module 200 has a structure in which the mounting land 132 is spaced apart from the inductor L2 in the multilayer circuit substrate 110.

Therefore, with the multilayer substrate module 200, even though the inductor L2 is provided, degradation of the isolation characteristics of the mounting land 132 is prevented.

Third Preferred Embodiment

Hereafter, a multilayer substrate module 300 according to a third preferred embodiment of the present invention will be described.

Figure 5:
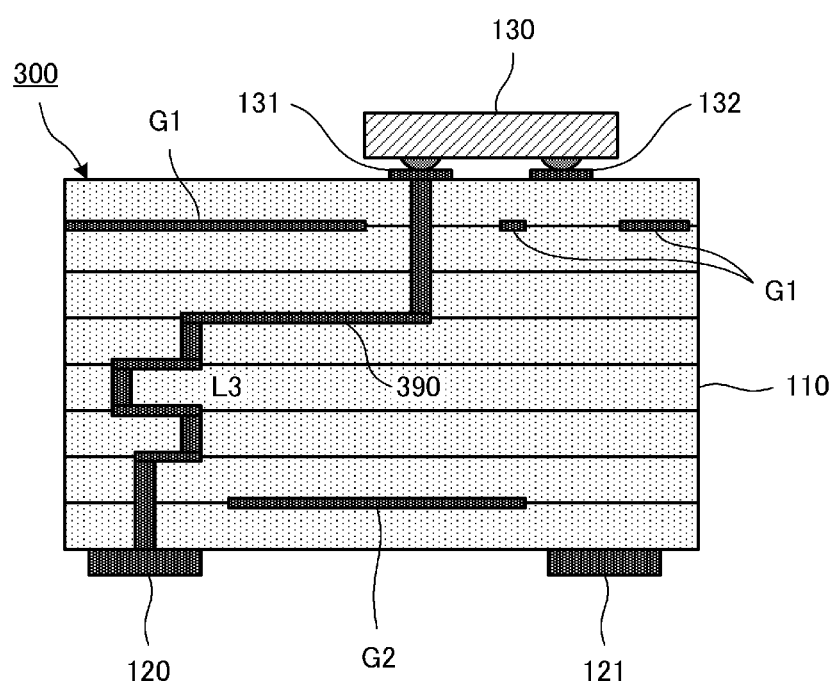
FIG. 5 is a sectional view of a principle portion of a multilayer substrate module according to a third preferred embodiment of the present invention.

FIG. 5 is a sectional view of a principle portion of the multilayer substrate module 300 according to the third preferred embodiment of the present invention. The multilayer substrate module 300 according to the third preferred embodiment differs from the multilayer substrate module 100 according to the first preferred embodiment in that it includes a wiring line 390 instead of the wiring line 190. The rest of the configuration of the multilayer substrate module 300 is preferably the same or substantially the same as that of the multilayer substrate module 100 and therefore description thereof will be omitted.

In more detail, inside the multilayer circuit substrate 110, as illustrated in FIG. 5, the wiring line 390 that connects the mounting land 131 and the input/output terminal 120, an inductor L3 that defines a portion of the wiring line 390, the first ground conductor G1 and the second ground conductor G2 are defined by conductor patterns.

The inductor L3 is connected in series with the mounting land 131. In addition, the area where the inductor L3 is located is superposed with the area where the input/output terminal 120 is located when the one main surface or the other main surface of the multilayer circuit substrate 110 is viewed in plan.

Here, the area where the inductor L3 is located is not superposed with the area where the second ground conductor G2 is located when the one main surface or the other main surface of the multilayer circuit substrate 110 is viewed in plan, as illustrated in FIG. 5, the second ground conductor G2 being closer to the layer where the inductor L3 is located than the first ground conductor G1 is. That is, the second ground conductor G2 does not face the inductor L3.

Consequently, even though a magnetic field is generated by the inductor L3 when a signal is transmitted through the inductor L3, this magnetic field substantially does not act on the second ground conductor G2 and generation of an eddy current in the second ground conductor G2 is sufficiently reduced or prevented.

Therefore, the same effect as with the multilayer substrate module 100 is obtained with the multilayer substrate module 300.

In addition, the area where the inductor L3 is located, as illustrated in FIG. 5, is superposed with the area where the input/output terminal 120 is located when the one main surface or the other main surface of the multilayer circuit substrate 110 is viewed in plan. Furthermore, the other input/output terminal 121 is located in a region in which the input/output terminal 120 is not located on the other main surface of the multilayer circuit substrate 110.

Consequently, in the multilayer substrate module 300, the area where the inductor L3 is located is not superposed with the area where the input/output terminal 121 is located. That is, the multilayer substrate module 300 has a structure in which the input/output terminal 121 is spaced apart from the inductor L3 in the multilayer circuit substrate 110.

Therefore, with the multilayer substrate module 300, even though the inductor L3 is provided, degradation of the isolation characteristics of the input/output terminal 121 is prevented.

Fourth Preferred Embodiment

Hereafter, a multilayer substrate module 400 according to a fourth preferred embodiment of the present invention will be described.

Figure 6:
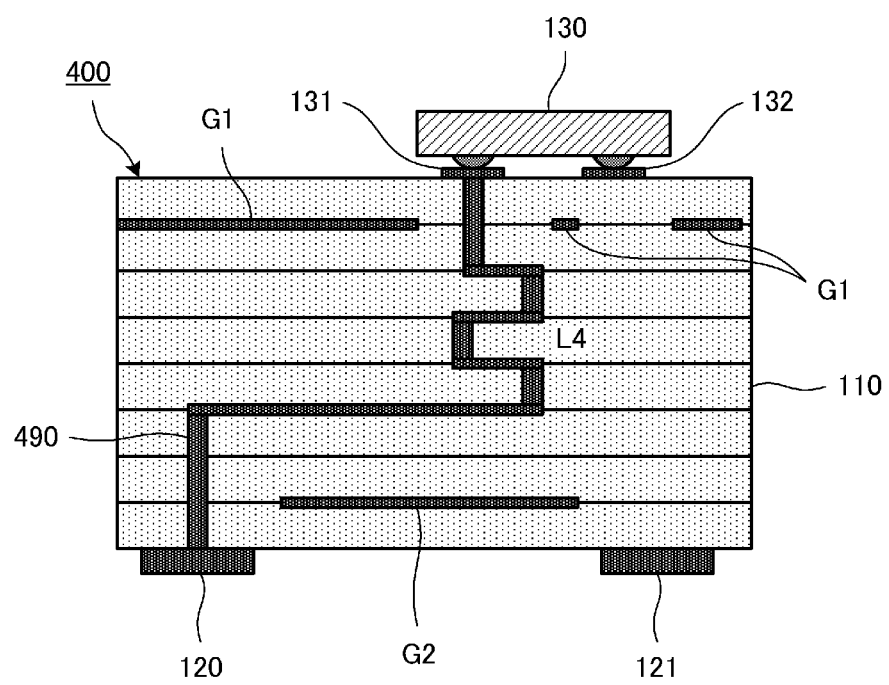
FIG. 6 is a sectional view of a principle portion of a multilayer substrate module according to a fourth preferred embodiment of the present invention.

FIG. 6 is a sectional view of a principal portion of the multilayer substrate module 400 according to the fourth preferred embodiment of the present invention. The multilayer substrate module 400 according to the fourth preferred embodiment differs from the multilayer substrate module 100 according to the first preferred embodiment in that it includes a wiring line 490 instead of the wiring line 190. The rest of the configuration of the multilayer substrate module 400 preferably is the same or substantially the same as that of the multilayer substrate module 100 and therefore description thereof will be omitted.

In more detail, inside the multilayer circuit substrate 110, as illustrated in FIG. 6, the wiring line 490 that connects the mounting land 131 and the input/output terminal 120, an inductor L4 that defines a portion of the wiring line 490, the first ground conductor G1 and the second ground conductor G2 are defined by conductor patterns.

The inductor L4 is connected in series with the mounting land 131. In addition, the area where the inductor L4 is located is superposed with the area where the mounting land 131 is located when the one main surface or the other main surface of the multilayer circuit substrate 110 is viewed in plan.

Here, the area where inductor L4 is located is not superposed with the area where the first ground conductor G1 is located when the one main surface or the other main surface of the multilayer circuit substrate 110 is viewed in plan, as illustrated in FIG. 6, the first ground conductor G1 being closer to the layer where the inductor L4 is located than the second ground conductor G2 is. That is, the first ground conductor G1 does not face the inductor L4.

Consequently, even though a magnetic field is generated by the inductor L4 when a signal is transmitted through the inductor L4, this magnetic field substantially does not act on the first ground conductor G1 and generation of an eddy current in the first ground conductor G1 is sufficiently reduced or prevented.

Therefore, the same effect as with the multilayer substrate module 100 is obtained with the multilayer substrate module 400.

In addition, the area where the inductor L4 is located, as illustrated in FIG. 6, is superposed with the area where the mounting land 131 is located when the one main surface or the other main surface of the multilayer circuit substrate 110 is viewed in plan. Furthermore, the other mounting land 132 is located in a region in which the mounting land 131 is not located on the one main surface of the multilayer circuit substrate 110.

Consequently, in the multilayer substrate module 400, the area where the inductor L4 is located is not superposed with the area where the mounting land 132 is located. That is, the multilayer substrate module 400 has a structure in which the mounting land 132 is spaced apart from the inductor L4 in the multilayer circuit substrate 110.

Therefore, with the multilayer substrate module 400, even though the inductor L4 is provided, degradation of the isolation characteristics of the mounting land 132 is prevented.

Fifth Preferred Embodiment

Hereafter, a multilayer substrate module 500 according to a fifth preferred embodiment of the present invention will be described.

Figure 7:
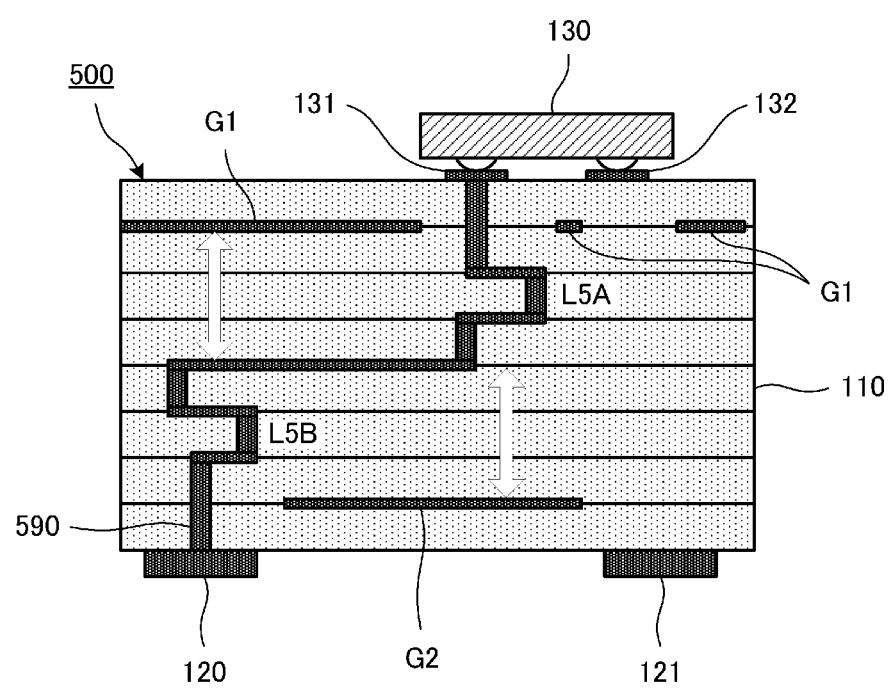
FIG. 7 is a sectional view of a principle portion of a multilayer substrate module according to a fifth preferred embodiment of the present invention.

FIG. 7 is a sectional view of a principal portion of the multilayer substrate module 500 according to the fifth embodiment of the present invention. The multilayer substrate module 500 according to the fifth embodiment differs from the multilayer substrate module 100 according to the first preferred embodiment in that it includes a wiring line 590 instead of the wiring line 190. The rest of the configuration of the multilayer substrate module 500 is preferably the same or substantially the same as that of the multilayer substrate module 100 and therefore description thereof will be omitted.

In more detail, inside the multilayer circuit substrate 110, as illustrated in FIG. 7, the wiring line 590 that connects the mounting land 131 and the input/output terminal 120, inductors L5A and L5B that each define a portion of the wiring line 590, the first ground conductor G1 and the second ground conductor G2 are defined by conductor patterns.

The inductor L5A corresponds to a "first inductor". In addition, the inductor L5B corresponds to a "second inductor".

The inductors L5A and L5B are connected in series with the mounting land 131. The inductor L5A is located in an area that is not superposed with the inductor L5B when the one main surface or the other main surface of the multilayer circuit substrate 110 is viewed in plan.

In addition, the area where the inductor L5A is located is superposed with the area where the mounting land 131 is located when the one main surface or the other main surface of the multilayer circuit substrate 110 is viewed in plan. In addition, the area where the inductor L5B is located is superposed with the area where the input/output terminal 120 is located when the one main surface or the other main surface of the multilayer circuit substrate 110 is viewed in plan.

Here, the area where the inductor L5A is located is not superposed with the area where the first ground conductor G1 is located when the one main surface or the other main surface of the multilayer circuit substrate 110 is viewed in plan, as illustrated in FIG. 7, the first ground conductor G1 being closer to the layer where the inductor L5A is located than the second ground conductor G2 is.

Similarly, the area where the inductor L5B is located is not superposed with the area where the second ground conductor G2 is located when the one main surface or the other main surface of the multilayer circuit substrate 110 is viewed in plan, as illustrated in FIG. 7, the second ground conductor G2 being closer to the layer where the inductor L5B is located than the first ground conductor G1 is.

That is, the first ground conductor G1 does not face the inductor L5A and the second ground conductor G2 does not face the inductor L5B.

In addition, the distance between the inductor L5A and the second ground conductor G2 in the multilayer substrate module 500 is larger than the distance between the inductor L4 and the second ground conductor G2 in the multilayer substrate module 400 (refer FIG. 6 and arrow in FIG. 7).

In addition, the distance between the inductor L5B and the first ground conductor G1 in the multilayer substrate module 500 is larger than the distance between the inductor L1 and the first ground conductor G1 in the multilayer substrate module 100 (refer to FIG. 3 and arrow in FIG. 7).

Consequently, even though a magnetic field is generated by the inductor L5B when a signal is transmitted through the inductor L5B, this magnetic field substantially does not act on the first ground conductor G1 and the second ground conductor G2 and generation of an eddy current is sufficiently reduced or prevented in both the first ground conductor G1 and the second ground conductor G2.

Similarly, even though a magnetic field is generated by the inductor L5A when a signal is transmitted through the inductor L5A, this magnetic field substantially does not act on the first ground conductor G1 and the second ground conductor G2 and generation of an eddy current is sufficiently reduced or prevented in both the first ground conductor G1 and the second ground conductor G2.

Therefore, the Q values of the inductors L5A and L5B are further improved with the multilayer substrate module 500 compared with the multilayer substrate module 100. Consequently, the IL improvement effect obtained with the multilayer substrate module 500 is greater than that obtained with the multilayer substrate module 100.

In addition, the area where the inductor L5A is located is superposed with the area where the mounting land 131 is located when the one main surface or the other main surface of the multilayer circuit substrate 110 is viewed in plan, as illustrated in FIG. 7. Furthermore, the other mounting land 132 is located in a region in which the mounting land 131 is not located on the one main surface of the multilayer circuit substrate 110.

In addition, the area where the inductor L5B is located is superposed with the area where the input/output terminal 120 is located when the one main surface or the other main surface of the multilayer circuit substrate 110 is viewed in plan, as illustrated in FIG. 7. Furthermore, the other input/output terminal 121 is located in a region in which the input/output terminal 120 is not located on the other main surface of the multilayer circuit substrate 110.

Consequently, in the multilayer substrate module 500, the areas where the inductors L5A and L5B are located are not superposed with the areas where the mounting land 132 and the input/output terminal 121 are located. That is, the multilayer substrate module 500 has a structure in which the mounting land 132 and the input/output terminal 121 are spaced apart from the inductors L5A and L5B in the multilayer circuit substrate 110.

Therefore, with the multilayer substrate module 500, even though the inductors L5A and L5B are provided, degradation of the isolation characteristics of the mounting land 132 and the input/output terminal 121 is prevented.

Sixth Preferred Embodiment

Hereafter, a multilayer substrate module 600 according to a sixth preferred embodiment of the present invention will be described.

Figure 8:
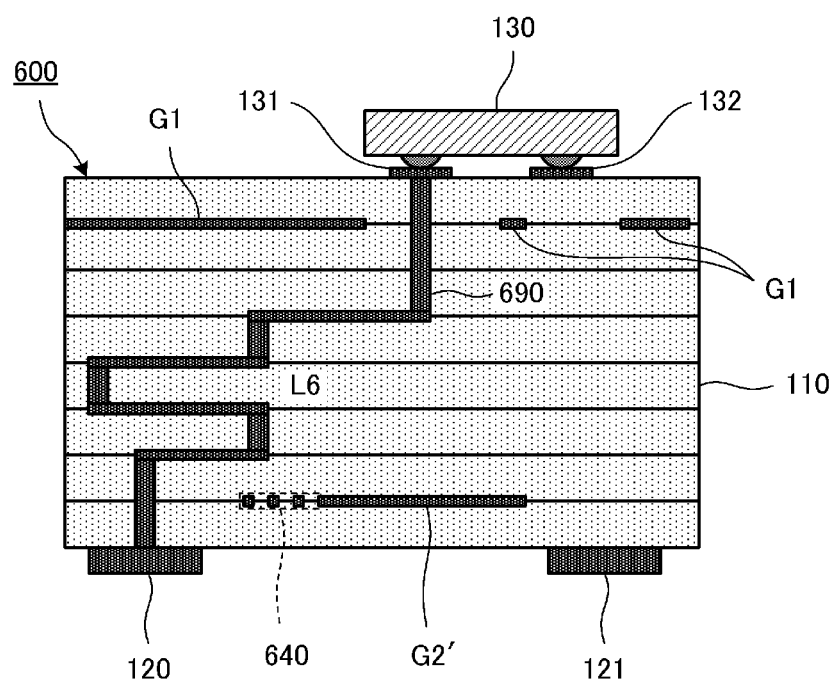
FIG. 8 is a sectional view of a principal portion of a multilayer substrate module according to a sixth preferred embodiment of the present invention.

FIG. 8 is a sectional view of a principal portion of the multilayer substrate module 600 according to a sixth preferred embodiment of the present invention. The multilayer substrate module 600 according to the sixth preferred embodiment differs from the multilayer substrate module 100 according to the first preferred embodiment in that it includes a wiring line 690 and a second ground conductor G2' instead of the wiring 190 and the second ground conductor G2. The rest of the configuration of the multilayer substrate module 600 preferably is the same or substantially the same as that of the multilayer substrate module 100 and therefore description thereof will be omitted.

In more detail, inside the multilayer circuit substrate 110, as illustrated in FIG. 8, the wiring line 690 that connects the mounting land 131 and the input/output terminal 120, an inductor L6 that defines a portion of the wiring line 690, the first ground conductor G1 and the second ground conductor G2' are defined by conductor patterns.

The second ground conductor G2' includes an opening portion 640 located therein that contains the area where the inductor L6 is located when the one main surface or the other main surface of the multilayer circuit substrate 110 is viewed in plan. That is, the area where the inductor L6 is located is superposed with the opening portion 640 and is not superposed with the area where the second ground conductor G2' is located when the one main surface or the other main surface of the multilayer circuit substrate 110 is viewed in plan. The rest of the configuration of the second ground conductor G2' is preferably the same or substantially the same as that of the second ground conductor G2 and therefore description thereof will be omitted.

The inductor L6 is connected in series with the mounting land 131. In addition, the area where the inductor L6 is located is superposed with the area where the input/output terminal 120 is located when the one main surface or the other main surface of the multilayer circuit substrate 110 is viewed in plan.

Here, the area where the inductor L6 is located is not superposed with the area where the second ground conductor G2' is located when the one main surface or the other main surface of the multilayer circuit substrate 110 is viewed in plan, as illustrated in FIG. 8, the second ground conductor G2' being closer to the layer where the inductor L6 is located than the first ground conductor G1 is. That is, the second ground conductor G2' does not face the inductor L6.

Consequently, even though a magnetic field is generated by the inductor L6 when a signal is transmitted through the inductor L6, this magnetic field substantially does not act on the second ground conductor G2' and generation of an eddy current in the second ground conductor G2' is sufficiently reduced or prevented.

Therefore, the same effect as with the multilayer substrate module 100 is obtained with the multilayer substrate module 600.

In addition, the area where the inductor L6 is located, as illustrated in FIG. 8, is superposed with the area where the input/output terminal 120 is located when the one main surface or the other main surface of the multilayer circuit substrate 110 is viewed in plan. Furthermore, the other input/output terminal 121 is located in a region in which the input/output terminal 120 is not located on the other main surface of the multilayer circuit substrate 110.

Consequently, in the multilayer substrate module 600, the area where the inductor L6 is located is not superposed with the area where the input/output terminal 121 is located. That is, the multilayer substrate module 600 has a structure in which the input/output terminal 121 is spaced apart from the inductor L6 in the multilayer circuit substrate 110. Therefore, with the multilayer substrate module 600, even though the inductor L6 is provided, degradation of the isolation characteristics of the input/output terminal 121 is prevented.

In addition, in the multilayer substrate module 600, the multilayer circuit substrate 110 is arranged such that the area where the inductor L6 is located is not superposed with the area where the second ground conductor G2' is located by simply providing an opening in a portion of the second ground conductor G2.

Therefore, with the multilayer substrate module 600, it is not necessary to change the design of the conductor patterns in the area where the inductor L6 is located and therefore the cost of manufacturing the multilayer substrate module 600 is reduced.

Seventh Preferred Embodiment

Hereafter, a multilayer substrate module 700 according to a seventh preferred embodiment of the present invention will be described.

Figure 9:
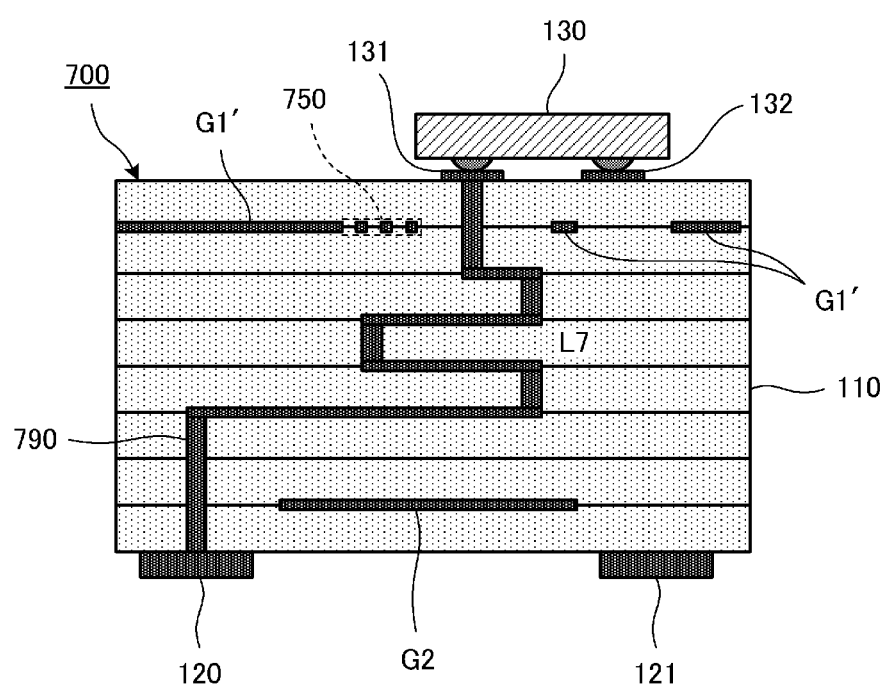
FIG. 9 is a sectional view of a principal portion of a multilayer substrate module according to a seventh preferred embodiment of the present invention.

FIG. 9 is a sectional view of a principal portion of the multilayer substrate module 700 according to the seventh preferred embodiment of the present invention. The multilayer substrate module 700 according to the seventh preferred embodiment differs from the multilayer substrate module 100 according to the first preferred embodiment in that it includes a wiring line 790 and a first ground conductor G1' instead of the wiring line 190 and the first ground conductor G1. The rest of the configuration of the multilayer substrate module 700 is the same as that of the multilayer substrate module 100 and therefore description thereof will be omitted.

In more detail, inside the multilayer circuit substrate 110, as illustrated in FIG. 9, the wiring line 790 that connects the mounting land 131 and the input/output terminal 120, an inductor L7 that defines a portion of the wiring line 790, the first ground conductor G1' and the second ground conductor G2 are defined by conductor patterns.

The first ground conductor G1' includes an opening portion 750 that contains the area where the inductor L7 is located when the one main surface or the other main surface of the multilayer circuit substrate 110 is viewed in plan. That is, the area where the inductor L7 is located is superposed with the opening portion 750 and is not superposed with the area where the first ground conductor G1' is located when the one main surface or the other main surface of the multilayer circuit substrate 110 is viewed in plan. The rest of the configuration of the first ground conductor G1' is preferably the same or substantially the same as that of the first ground conductor G1 and therefore description thereof will be omitted.

The inductor L7 is connected in series with the mounting land 131. In addition, the area where the inductor L7 is located is superposed with the area where the mounting land 131 is located when the one main surface or the other main surface of the multilayer circuit substrate 110 is viewed in plan.

Here, the area where the inductor L7 is located, as illustrated in FIG. 9, is not superposed with the area where the first ground conductor G1' is located when the one main surface or the other main surface of the multilayer circuit substrate 110 is viewed in plan, the first ground conductor G1' being closer to the layer where the inductor L7 is located than the second ground conductor G2 is. That is, the first ground conductor G1' does not face the inductor L7.

Consequently, even though a magnetic field is generated by the inductor L7 when a signal is transmitted through the inductor L7, this magnetic field substantially does not act on the first ground conductor G1' and generation of an eddy current in the first ground conductor G1' is sufficiently suppressed.

Therefore, the same effect as with the multilayer substrate module 100 is obtained with the multilayer substrate module 700.

In addition, the area where the inductor L7 is located, as illustrated in FIG. 9, is superposed with the area where the mounting land 131 is located when the one main surface or the other main surface of the multilayer circuit substrate 110 is viewed in plan. Furthermore, the other mounting land 132 is located in a region in which the mounting land 131 is not located on the one main surface of the multilayer circuit substrate 110.

Consequently, in the multilayer substrate module 700, the area where the inductor L7 is located is not superposed with the area where the mounting land 132 is located. That is, the multilayer substrate module 700 has a structure in which the mounting land 132 is spaced apart from the inductor L7 in the multilayer circuit substrate 110. Therefore, with the multilayer substrate module 700, even though the inductor L7 is provided, degradation of the isolation characteristics of the mounting land 132 is prevented.

In addition, in the multilayer substrate module 700, the multilayer circuit substrate 110 is arranged such that the area where the inductor L7 is located is not superposed with the area where the first ground conductor G1' is located by simply providing an opening in a portion of the first ground conductor G1.

Therefore, with the multilayer substrate module 700, it is not necessary to change the design of the conductor patterns in the area where the inductor L7 is located and therefore the cost of manufacturing the multilayer substrate module 700 is reduced.

Eighth Preferred Embodiment

Hereafter, a multilayer substrate module 800 according to an eighth preferred embodiment of the present invention will be described.

Figure 10:
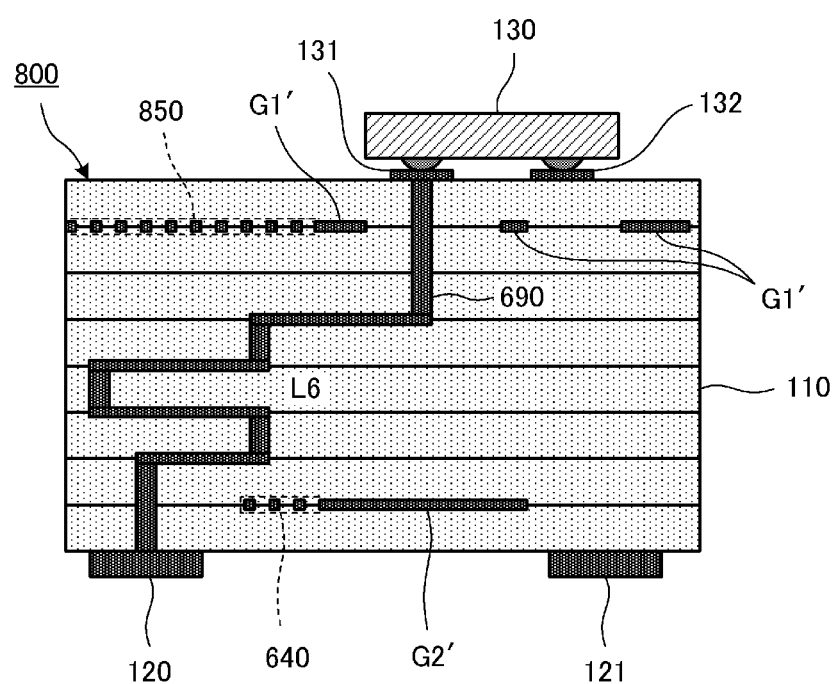
FIG. 10 is a sectional view of a principal portion of a multilayer substrate module according to an eighth preferred embodiment of the present invention.

FIG. 10 is a sectional view of a principal portion of the multilayer substrate module 800 according to the eighth preferred embodiment of the present invention. The multilayer substrate module 800 according to the eighth preferred embodiment differs from the multilayer substrate module 600 according to the sixth preferred embodiment in that it includes a first ground conductor G1' instead of the first ground conductor G1. The rest of the configuration of the multilayer substrate module 800 is preferably the same or substantially the same as that of the multilayer substrate module 600 and therefore description thereof will be omitted.

In more detail, inside the multilayer circuit substrate 110, as illustrated in FIG. 10, the wiring line 690 that connects the mounting land 131 and the input/output terminal 120, the inductor L6 that defines a portion of the wiring line 690, the first ground conductor G1' and the second ground conductor G2' are defined by conductor patterns.

The first ground conductor G1' includes an opening portion 850 that contains the area where the inductor L6 is located when the one main surface or the other main surface of the multilayer circuit substrate 110 is viewed in plan. The rest of the configuration of the first ground conductor G1' is preferably the same or substantially the same as that of the first ground conductor G1 and therefore description thereof will be omitted.

Here, the area where the inductor L6 is located, as illustrated in FIG. 10, is not superposed with either of the area where the first ground conductor G1' is located and the area where the second ground conductor G2' is located when the one main surface or the other main surface of the multilayer circuit substrate 110 is viewed in plan. That is, neither the first ground conductor G1' nor the ground conductor G2' faces the inductor L6.

Consequently, even though a magnetic field is generated by the inductor L6 when a signal is transmitted through the inductor L6, this magnetic field substantially does not act on the first ground conductor G1' and the second ground conductor G2' and generation of an eddy current in both the first ground conductor G1' and the second ground conductor G2' is sufficiently reduced or prevented.

Therefore, the Q value of the inductor L6 is further improved with the multilayer substrate module 800 compared with the multilayer substrate module 100. Consequently, the IL improvement effect obtained with the multilayer substrate module 800 is greater than that obtained with the multilayer substrate module 100.

In addition, the area where the inductor L6 is located, as illustrated in FIG. 10, is superposed with the area where the input/output terminal 120 is located when the one main surface or the other main surface of the multilayer circuit substrate 110 is viewed in plan. Furthermore, the other input/output terminal 121 is located in a region in which the input/output terminal 120 is not located on the other main surface of the multilayer circuit substrate 110.

Consequently, in the multilayer substrate module 800, the area where the inductor L6 is located is not superposed with the area where the input/output terminal 121 is located. That is, the multilayer substrate module 800 has a structure in which the input/output terminal 121 is spaced apart from the inductor L6 in the multilayer circuit substrate 110.

Therefore, with the multilayer substrate module 800, even though the inductor L6 is provided, degradation of the isolation characteristics of the input/output terminal 121 is prevented.

In addition, in the multilayer substrate module 800, the multilayer circuit substrate 110 is arranged such that the area where the inductor L6 is located is not superposed with the areas where the first ground conductor G1' and the second ground conductor G2' are located by simply providing an opening in a portion of the first ground conductor G1 and in a portion of the second ground conductor G2.

Therefore, with the multilayer substrate module 800, it is not necessary to change the design of the conductor patterns in the area where the inductor L6 is located and therefore the cost of manufacturing the multilayer substrate module 800 is reduced.

Ninth Preferred Embodiment

Hereafter, a multilayer substrate module 900 according to a ninth preferred embodiment of the present invention will be described.

Figure 11:
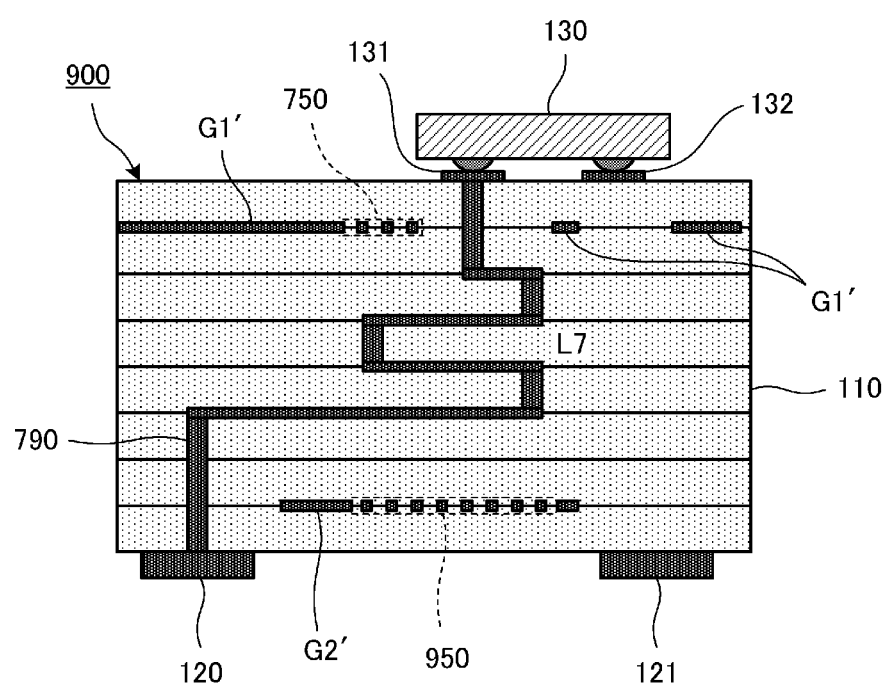
FIG. 11 is a sectional view of a principal portion of a multilayer substrate module according to a ninth preferred embodiment of the present invention.

FIG. 11 is a sectional view of a principal portion of the multilayer substrate module 900 according to the ninth preferred embodiment of the present invention. The multilayer substrate module 900 according to the ninth preferred embodiment differs from the multilayer substrate module 700 according to the seventh preferred embodiment in that it includes a second ground conductor G2' instead of the second ground conductor G2. The rest of the configuration of the multilayer substrate module 900 is preferably the same or substantially the same as that of the multilayer substrate module 700 and therefore description thereof will be omitted.

In more detail, inside the multilayer circuit substrate 110, as illustrated in FIG. 11, the wiring line 790 that connects the mounting land 131 and the input/output terminal 120, the inductor L7 that defines a portion of the wiring line 790, the first ground conductor G1' and the second ground conductor G2' are defined by conductor patterns.

The second ground conductor G2' includes an opening portion 950 that contains the area where the inductor L7 is located when the one main surface or the other main surface of the multilayer circuit substrate 110 is viewed in plan. The rest of the configuration of the second ground conductor G2' preferably is the same or substantially the same as that of the second ground conductor G2 and therefore description thereof will be omitted.

Here, the area where the inductor L7 is located, as illustrated in FIG. 11, is not superposed with either of the area where the first ground conductor G1' is located and the area where the second ground conductor G2' is located when the one main surface or the other main surface of the multilayer circuit substrate 110 is viewed in plan. That is, neither the first ground conductor G1' nor the second ground conductor G2' faces the inductor L7.

Consequently, even though a magnetic field is generated by the inductor L7 when a signal is transmitted through the inductor L7, this magnetic field substantially does not act on the first ground conductor G1' and the second ground conductor G2' and generation of an eddy current in both the first ground conductor G1' and the second ground conductor G2' is sufficiently reduced or prevented.

Therefore, the Q value of the inductor L7 is further improved with the multilayer substrate module 900 compared with the multilayer substrate module 100. Consequently, the IL improvement effect obtained with the multilayer substrate module 900 is greater than that obtained with the multilayer substrate module 100.

In addition, the area where the inductor L7 is located, as illustrated in FIG. 11, is superposed with the area where the mounting land 131 is located when the one main surface or the other main surface of the multilayer circuit substrate 110 is viewed in plan. Furthermore, the other mounting land 132 is located in a region in which the mounting land 131 is not located on the one main surface of the multilayer circuit substrate 110.

Consequently, in the multilayer substrate module 900, the area where the inductor L7 is located is not superposed with the area where the mounting land 132 is located. That is, the multilayer substrate module 900 has a structure in which the mounting land 132 is spaced apart from the inductor L7 in the multilayer circuit substrate 110.

Therefore, with the multilayer substrate module 900, even though the inductor L7 is provided, degradation of the isolation characteristics of the mounting land 132 is prevented.

In addition, in the multilayer substrate module 900, the multilayer circuit substrate 110 is arranged such that the area where the inductor L7 is located is not superposed with the area where the first ground conductor G1' is located and the area where the second ground conductor G2' is located by simply providing an opening in a portion of the first ground conductor G1 and in a portion of the second ground conductor G2.

Therefore, with the multilayer substrate module 900, it is not necessary to change the design of the conductor patterns in the area where the inductor L7 is located and therefore the cost of manufacturing the multilayer substrate module 900 is reduced.

Tenth Preferred Embodiment

Hereafter, a multilayer substrate module 1000 according to a tenth preferred embodiment of the present invention will be described.

Figure 12:
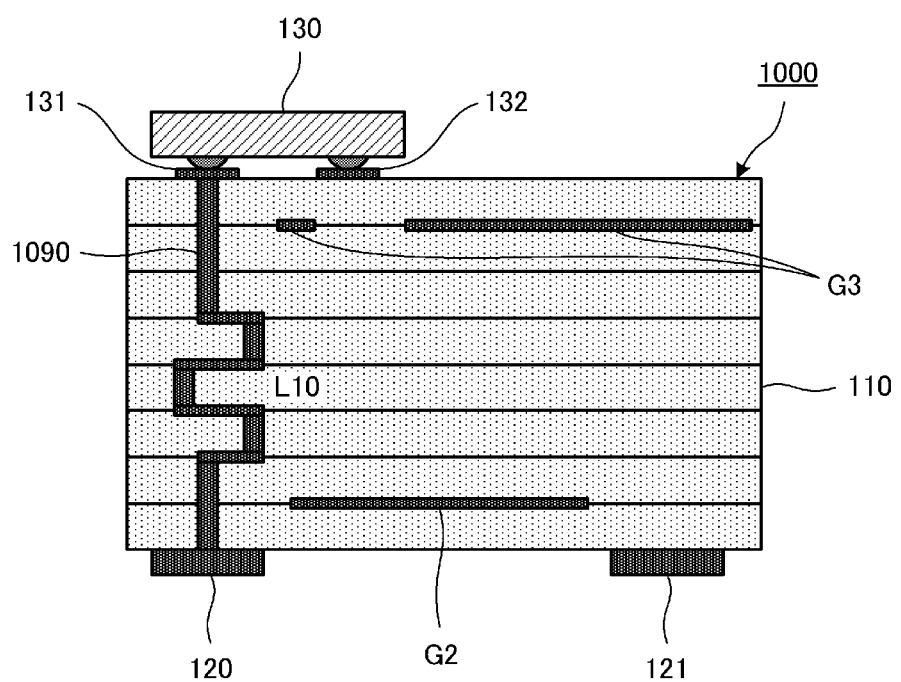
FIG. 12 is a sectional view of a principal portion of a multilayer substrate module according to a tenth preferred embodiment of the present invention.

FIG. 12 is a sectional view of a principal portion of the multilayer substrate module 1000 according to the tenth preferred embodiment of the present invention. The multilayer substrate module 1000 according to the tenth preferred embodiment differs from the multilayer substrate module 100 according to the first preferred embodiment in that it includes a wiring line 1090 and a first ground conductor G3 instead of the wiring line 190 and the first ground electrode G1. The rest of the configuration of the multilayer substrate module 1000 preferably is the same or substantially the same as that of the multilayer substrate module 100 and therefore description thereof will be omitted.

In more detail, inside the multilayer circuit substrate 110, as illustrated in FIG. 12, the wiring line 1090 that connects the mounting land 131 and the input/output terminal 120, an inductor L10 that defines a portion of the wiring line 1090, the first ground conductor G3 and the second ground conductor G2 are defined by conductor patterns.

The first ground conductor G3 is located in an area that is not superposed with the inductor L10 when the one main surface or the other main surface of the multilayer circuit substrate 110 is viewed in plan.

Similarly, the second ground conductor G2 is also located in an area that is not superposed with the inductor L10 when the one main surface or the other main surface of the multilayer circuit substrate 110 is viewed in plan.

In addition, the inductor L10 is connected in series with the mounting land 131. In addition, the area where the inductor L10 is located is superposed with the area where the input/output terminal 120 is located and the area where the mounting land 131 is located when the one main surface or the other main surface of the multilayer circuit substrate 110 is viewed in plan.

Here, the area where the inductor L10 is located is not superposed with either of the area where the first ground conductor G3 is located and the area where the second ground conductor G2 is located when the one main surface or the other main surface of the multilayer circuit substrate 110 is viewed in plan, as illustrated in FIG. 12. That is, neither the first ground conductor G3 nor the second ground conductor G2 faces the inductor L10.

Consequently, even though a magnetic field is generated by the inductor L10 when a signal is transmitted through the inductor L10, this magnetic field substantially does not act on the first ground conductor G3 and the second ground conductor G2 and generation of an eddy current in both the first ground conductor G3 and the second ground conductor G2 is sufficiently reduced or prevented.

Therefore, the Q value of the inductor L10 is further improved with the multilayer substrate module 1000 compared with the multilayer substrate module 100. Consequently, the IL improvement effect obtained with the multilayer substrate module 1000 is greater than that obtained with the multilayer substrate module 100.

In addition, the area where the inductor L10 is located, as illustrated in FIG. 12, is superposed with the area where the mounting land 131 is located when the one main surface or the other main surface of the multilayer circuit substrate 110 is viewed in plan. Furthermore, the other mounting land 132 is located in a region in which the mounting land 131 is not located on the one main surface of the multilayer circuit substrate 110.

In addition, the area where the inductor L10 is located, as illustrated in FIG. 12, is superposed with the area where the input/output terminal 120 is located when the one main surface or the other main surface of the multilayer circuit substrate 110 is viewed in plan. Furthermore, the other input/output terminal 121 is located in a region in which the input/output terminal 120 is not located on the other main surface of the multilayer circuit substrate 110.

Consequently, in the multilayer substrate module 1000, the area where the inductor L10 is located is not superposed with the area where the mounting land 132 is located and the area where the input/output terminal 121 is located. That is, the multilayer substrate module 1000 has a structure in which the mounting land 132 and the input/output terminal 121 are spaced apart from the inductor L10 in the multilayer circuit substrate 110.

Therefore, with the multilayer substrate module 1000, even though the inductor L10 is provided, degradation of the isolation characteristics of the mounting land 132 and the input/output terminal 121 is prevented.

Other Preferred Embodiments

In the above-described preferred embodiments, the switch IC 130 preferably is mounted on the mounting lands 131 and 132, but the preferred embodiments are not limited to this. For example, another mount component such as a surface acoustic wave (SAW) filter device may be mounted on the mounting lands 131 and 132.

Finally, the descriptions of the above preferred embodiments are illustrative in all points and not restrictive. The scope of the present invention is determined by the following claims rather than by the above-described preferred embodiments. In addition, it is intended that equivalents to the scope of the claims and all modifications that are within the scope of the claims be included within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate module comprising:
 a multilayer circuit substrate including a plurality of layers stacked on top of one another in a stacking direction and including conductor patterns located on the layers;
 a first external connection terminal located on one main surface of the multilayer circuit substrate; and a second external connection terminal located on another main surface of the multilayer circuit substrate; wherein a wiring line that connects the first external connection terminal and the second external connection terminal to each other, an inductor that defines a portion of the wiring line, a first ground conductor that is positioned on the one main surface side of the inductor, and a second ground conductor that is positioned on the other main surface side of the inductor are defined by the conductor patterns inside the multilayer circuit substrate; and an area where the inductor is located is not superposed with an area where one of the first ground conductor and the second ground conductor that is closer to the layer including the inductor is located when the multilayer circuit substrate is viewed in plan.

2. The multilayer substrate module according to claim 1, wherein the area where the inductor is located is superposed with at least one of the area where the first external connection terminal is located and the area where the second external connection terminal is located when the multilayer circuit substrate is viewed in plan.

3. The multilayer substrate module according to claim 1, wherein an opening is arranged in the ground conductor such that the area where the ground conductor is located is not superposed with the area where the inductor is located when the multilayer circuit substrate is viewed in plan.

4. The multilayer substrate module according to claim 1, wherein a first portion of the inductor defines a first inductor and a second portion of the inductor defines a second inductor;

the first inductor is located in an area that is not superposed with the second inductor when the multilayer circuit substrate is viewed in plan.

5. The multilayer substrate module according to claim 1, wherein the area where the inductor is located is not superposed with either of the area where the first ground conductor is located and the area where the second ground conductor is located when the multilayer circuit substrate is viewed in plan.

6. The multilayer substrate module according to claim 1, wherein the inductor is connected in series with the first external connection terminal.

7. The multilayer substrate module according to claim 1, wherein the inductor connects the wiring line to the first ground conductor or the second ground conductor.

8. The multilayer substrate module according to claim 1, wherein the first external connection terminal includes a mounting land and the second external connection terminal includes an input/output terminal.

9. The multilayer substrate module according to claim 1, further comprising a switch IC mounted on the multilayer circuit substrate.

10. The multilayer substrate module according to claim 9, wherein the switch IC includes an antenna connection port that is connected to an antenna and a plurality of high-frequency input/output ports.

11. The multilayer substrate module according to claim 1, wherein the inductor shunt-connects the wiring line to the first ground conductor.

12. The multilayer substrate module according to claim 1, wherein the second ground conductor does not face the inductor.

13. The multilayer substrate module according to claim 8, wherein the input/output terminal is spaced apart from the inductor in the multilayer circuit substrate.

14. The multilayer substrate module according to claim 1, wherein the wiring line extends from a top surface of the multilayer circuit substrate to a location below a center of the multilayer circuit substrate in the stacking direction.

15. The multilayer substrate module according to claim 14, wherein the wiring line is located in a central portion of the multilayer circuit substrate in a width direction of the multilayer circuit substrate that is perpendicular to the stacking direction.

16. The multilayer substrate module according to claim 1, wherein the wiring line extends from a bottom surface of the multilayer circuit substrate to a location above a center of the multilayer circuit substrate in the stacking direction.

17. The multilayer substrate module according to claim 16, wherein the wiring line is located to one side of a central portion of the multilayer circuit substrate in a width direction of the multilayer circuit substrate that is perpendicular to the stacking direction.

18. The multilayer substrate module according to claim 1, wherein the wiring line extends in a direction that is parallel or substantially parallel to the stacking direction.

19. The multilayer substrate module according to claim 1, wherein the wiring line extends in a direction that is perpendicular or substantially perpendicular to the stacking direction.

* * * * *